United States Patent
Kim et al.

(10) Patent No.: US 9,835,671 B2
(45) Date of Patent: Dec. 5, 2017

(54) METHOD OF DETECTING WIRING MISMATCH OF RESOLVER

(71) Applicant: Hyundai Motor Company, Seoul (KR)

(72) Inventors: Seong Min Kim, Gyeongsangnam-do (KR); Dae Woong Han, Gyeonggi-do (KR); Jeong Won Roh, Seoul (KR)

(73) Assignee: Hyundai Motor Company, Seoul (KR)

( * ) Notice: Subject to any disclaimer, the term of this patent is extended or adjusted under 35 U.S.C. 154(b) by 135 days.

(21) Appl. No.: 14/570,103

(22) Filed: Dec. 15, 2014

(65) Prior Publication Data

US 2016/0025796 A1    Jan. 28, 2016

(30) Foreign Application Priority Data

Jul. 28, 2014 (KR) .......................... 10-2014-0095528

(51) Int. Cl.
    *G01R 31/02* (2006.01)
    *G01D 3/08* (2006.01)
    *G01D 5/20* (2006.01)

(52) U.S. Cl.
    CPC ............. *G01R 31/027* (2013.01); *G01D 3/08* (2013.01); *G01D 5/2073* (2013.01); *G01R 31/025* (2013.01)

(58) Field of Classification Search
    None
    See application file for complete search history.

(56) References Cited

U.S. PATENT DOCUMENTS

| | | | | |
|---|---|---|---|---|
| 5,216,236 A | * | 6/1993 | Blais ....................... | G01S 17/66 250/203.1 |
| 6,370,483 B1 | * | 4/2002 | Beckwith ........... | G01R 19/2513 361/35 |
| 6,377,053 B1 | * | 4/2002 | Mazzucco ............ | G01R 31/025 324/509 |
| 6,459,269 B1 | * | 10/2002 | Jones ..................... | H02H 3/337 324/509 |
| 2001/0054911 A1 | | 12/2001 | Kobayashi et al. | |
| 2005/0162292 A1 | * | 7/2005 | Kanekawa .............. | B60T 8/885 341/111 |
| 2005/0280570 A1 | * | 12/2005 | Kanekawa .............. | B60T 8/885 341/155 |

(Continued)

FOREIGN PATENT DOCUMENTS

| | | |
|---|---|---|
| EP | 1548411 A2 | 6/2005 |
| EP | 1560085 A2 | 8/2005 |

(Continued)

*Primary Examiner* — Paresh Patel
(74) *Attorney, Agent, or Firm* — Mintz Levin Cohn Ferris Glovsky and Popeo, P.C.; Peter F. Corless

(57) ABSTRACT

According to the present disclosure, there are provided a method of determining which one of first and second input signals Rez+ and Rez− is shorted to ground based on a magnitude of a Lissajous signal, a method of determining which one of first and third output signals $S_1$ and $S_3$ is shorted to any one of the first and second input signals Rez+ and Rez− based on an average magnitude value of the third output signal $S_3$, and a method of determining which one of second and fourth output signals $S_2$ and $S_4$ is shorted to the first input signal Rez+ based on an average magnitude value of the fourth output signal $S_4$.

9 Claims, 4 Drawing Sheets

(56) References Cited

U.S. PATENT DOCUMENTS

2008/0278106 A1    11/2008   Fu et al.
2012/0185213 A1     7/2012   Wada et al.

FOREIGN PATENT DOCUMENTS

| | | |
|---|---|---|
| EP | 1942315 A2 | 7/2008 |
| JP | 2008-164560 A | 7/2008 |
| JP | 2009-139267 A | 6/2009 |
| JP | 2010-112899 A | 5/2010 |
| JP | 2011-089935 A | 5/2011 |
| JP | 2011-158389 A | 8/2011 |
| KR | 10-2007-0039385 A | 4/2007 |
| KR | 10-1039676 B1 | 6/2011 |
| KR | 10-2013-0029195 A | 3/2013 |
| KR | 10-2013-0064606 A | 6/2013 |

\* cited by examiner

■ TEST RESULTS ACCORDING TO THE RELATED ART (TYPICAL LOGIC): RESULTS OF INFOCODE

| Diagnosis | | Rez⁺ | Rez⁻ | $S_1$ | $S_2$ | $S_3$ | $S_4$ | GND |
|---|---|---|---|---|---|---|---|---|
| SHORT | Rez⁺ | | 1 | 9 | 11 | 13/9 | 15/11 | 2 |
| | Rez⁻ | | | 10 | 12 | 14/10 | 16 | 2 |
| | $S_1$ | | | | 17 | 3 | 18 | 7 |
| | $S_2$ | | | | | 9 | 4 | 6 |
| | $S_3$ | | | | | | 20 | 7 |
| | $S_4$ | | | | | | | 8 |
| DISCONNECTION | | 1 | 1 | 3 | 4 | 3 | 4 | |

METHOD OF DETECTING WIRING MISMATCH OF RESOLVER

CROSS-REFERENCE TO RELATED APPLICATION

This application claims under 35 U.S.C. §119(a) the benefit of and priority to Korean Patent Application No. 10-2014-0095528 filed on Jul. 28, 2014, the entire contents of which are incorporated herein by reference.

BACKGROUND (a) Technical Field

The present disclosure relates to a method of detecting wiring mismatch of a resolver. More particularly, it relates to a method of detecting wiring mismatch of a resolver for a Hybrid Electric Vehicle (HEV) to accurately analyze a fault code of the resolver, which detects the speed of a HEV traction motor and the angular position of a rotor.

(b) Background Art

Recently, due to high oil prices and carbon dioxide regulations, the development of eco-friendly vehicles, such as hybrid electric vehicles (HEVs), electric vehicles (EVs), and fuel cell vehicles (FCVs), for replacing typical internal combustion engine vehicles, has rapidly increased. These eco-friendly vehicles typically use an electric motor as a traction source, and as the traction motor, a Permanent Magnet Synchronous Motor (PMSM) having high power and efficiency (e.g., an Interior Permanent Magnet Synchronous Motor (IPMSM)) is widely used. Also, eco-friendly vehicles often include an inverter system for motor control, and a resolver to detect the absolute angular position θ of a rotor for motor control.

Generally, the resolver includes a stator, a rotor, and a rotary transformer. The coils of the stator and the rotor are wound such that flux distribution forms sine waves with respect to angular position. If a rotary shaft rotates after first and second input signals Rez+ and Rez− are applied to the primary side coils (i.e., input terminal), a magnetic coupling coefficient changes so that signals with changed amplitudes of carriers are generated from the secondary side coils (i.e., output terminals), whereby the secondary side coils are wound such that the signals change to form sine and cosine waves with respect to the angular position of the rotary shaft. As a result, the signals (i.e., output signals) generated from the secondary side coils have the forms of sine and cosine signals.

The resolver plays an important role in controlling a vehicle electric motor. Wiring mismatch of the resolver makes accurately measuring the position of the electric motor upon driving of the electric motor difficult, and accordingly, disables offset correction of the electric motor, thereby deteriorating the driving environment of the vehicle. In this regard, a conventional method of determining wiring mismatch of a resolver includes, for example: detecting a wiring mismatch of a resolver using deviation between plus (+) and minus (−) terminal signals that are first and second input signals Rez+ and Rez− of the primary side, and outputting signals of the secondary side, which are generated when the first and second input signals Rez+ and Rez− are applied. The test results are shown in FIG. 1. However, the conventional method of determining wiring mismatch of a resolver showed low accuracy in detecting a wiring mismatch, since the same infocode appeared with respect to different mismatching wirings. As shown in FIG. 1, when a first input signal Rez+ is shorted to a third output signal $S_3$, a value of 13 that is an infocode appeared together with a value of 9. Accordingly, the conventional techniques fail to represent an accurate infocode.

Korean Patent Laid-open Application No. 10-2013-0029195 (hereinafter, simply referred to as Document 1) discloses a system for detecting a fault of a resolver. Document 1 suggests a method of determining a fault sensing signal using sine and cosine signals. However, Document 1 also has the problem that the same infocode appears with respect to different mismatching wirings. Therefore, a more effective method of improving diagnosis reliability is needed.

The above information disclosed in this Background section is only for enhancement of understanding of the background of the disclosure, and therefore, it may contain information that does not form the related art that is already known in this country to a person of ordinary skill in the art.

SUMMARY OF THE DISCLOSURE

The present disclosure relates to a method of detecting a wiring mismatch, such that an accurate analysis can be performed when any one of first and second input signals Rez+ and Rez−, respectively, having the same infocode is shorted to ground, and when any one of the first and second input signals Rez+ and Rez− is shorted to any one of output signals. Accordingly, wiring mismatch of the first and second input signals Rez+ and Rez− that are input to the primary side having the same infocode is determined using the magnitude of a Lissajous signal in order to determine wiring mismatch of plus (+) and minus (−) input terminals, and a mismatching wiring having a redundant infocode can be accurately determined using the magnitudes of output signals of the secondary side, extracted when the first and second input signals Rez+ and Rez− are applied.

According to embodiments of the present disclosure, a method of detecting wiring mismatch of a resolver, the resolver including an input stage to which a first input signal Rez+ and a second input signal Rez− constituting excitation signals are input, a first output terminal to output a first output signal $S_1$ and a third output signal $S_3$ constituting a sine signal generated from the excitation signals, and a second output terminal to output a second output signal $S_2$ and a fourth output signal $S_4$ constituting a cosine signal generated from the excitation signals, includes:

determining whether the first input signal Rez+ or the second input signal Rez− is shorted to ground for an amount of time that is greater than or equal to a reference time period; and when it is determined that the first input signal Rez+ or the second input signal Rez− is shorted to the ground for the amount of time that is greater than or equal to the reference time period, determining which one of the first input signal Rez+ and the second input signal Rez− is shorted to the ground, based on a magnitude of a Lissajous signal obtained from the sine signal and the cosine signal.

The determining of which one of the first input signal Rez+ and the second input signal Rez− is shorted to the ground may include: comparing the magnitude of the Lissajous signal to a first setting value; determining that the second input signal Rez− is shorted to the ground when the magnitude of the Lissajous signal is less than or equal to the first setting value; and determining that the first input signal Rez+ is shorted to the ground when the magnitude of the Lissajous signal is greater than the first setting value.

The first setting value may be set to a predetermined value between an experimental value of a magnitude of a Lissajous signal measured when the second input signal Rez− is shorted to the ground and an experimental value of a magnitude of a Lissajous signal measured when the first input signal Rez+ is shorted to the ground.

Furthermore, according to embodiments of the present disclosure, a method of detecting wiring mismatch of a resolver, the resolver including an input stage to which a first input signal Rez+ and a second input signal Rez− constituting excitation signals are input, a first output terminal to output a first output signal $S_1$ and a third output signal $S_3$ constituting a sine signal generated from the excitation signals, and a second output terminal to output a second output signal $S_2$ and a fourth output signal $S_4$ constituting a cosine signal generated from the excitation signals, includes:

determining whether a target signal selected from the first input signal Rez+ and the second input signal Rez− is shorted to the first output terminal for an amount of time that is greater than or equal to a predetermined time period; and when it is determined that the target signal is shorted to the first output terminal for the amount of time that is greater than or equal to the reference time period, determining which one of the first output signal $S_1$ and the third input signal $S_3$ is shorted to the target signal, based on an average magnitude value of the third output signal $S_3$.

The determining of which one of the first output signal $S_1$ and the third input signal $S_3$ is shorted to the target signal may include: comparing the average magnitude value of the third output signal $S_3$ to a second setting value; determining that the first output signal $S_1$ is shorted to the target signal when the average magnitude value of the third output signal $S_3$ is less than the second setting value; and determining that the third output signal $S_3$ is shorted to the target signal when the average magnitude value of the third output signal $S_3$ is greater than or equal to the second setting value.

The second setting value may be set to a predetermined value between an average magnitude value of the third output signal $S_3$ measured when the first output signal $S_1$ is shorted to the target signal and an average magnitude value of the third output signal $S_3$ measured when the third output signal $S_3$ is shorted to the target signal.

Furthermore, according to embodiments of the present disclosure, a method of detecting wiring mismatch of a resolver, the resolver including an input stage to which a first input signal Rez+ and a second input signal Rez− constituting excitation signals are input, a first output terminal to output a first output signal $S_1$ and a third output signal $S_3$ constituting a sine signal generated from the excitation signals, and a second output terminal to output a second output signal $S_2$ and a fourth output signal $S_4$ constituting a cosine signal generated from the excitation signals, includes:

determining whether the first input signal Rez+ is shorted to the second output terminal for an amount of time that is greater than or equal to a predetermined time period; and when it is determined that the first input signal Rez+ is shorted to the second output terminal for the amount of time that is greater than or equal to the reference time period, determining which one of the second output signal $S_2$ and the fourth output signal $S_4$ is shorted to the first input signal Rez+, based on an average magnitude value of the fourth output signal $S_4$.

The determining of which one of the second output signal $S_2$ and the fourth output signal $S_4$ is shorted to the first input signal Rez+ may include: comparing the average magnitude value of the fourth output signal $S_4$ to a third setting value; determining that the second output signal $S_2$ is shorted to the first input signal Rez+ when the average magnitude value of the fourth output signal $S_4$ is less than the third setting value; and determining that the fourth output signal $S_4$ is shorted to the first input signal Rez+ when the average magnitude value of the fourth output signal $S_4$ is greater than or equal to the third setting value.

The third setting value may be set to a predetermined value between an average magnitude value of the fourth output signal $S_4$ measured when the second output signal $S_2$ is shorted to the first input signal Rez+ and an average magnitude value of the fourth output signal $S_4$ measured when the fourth output signal $S_4$ is shorted to the first input signal Rez+.

Furthermore, according to embodiments of the present disclosure, a non-transitory computer readable medium containing program instructions may perform the above-described processes.

Other aspects and embodiments of the disclosure are discussed infra.

BRIEF DESCRIPTION OF THE DRAWINGS

The above and other features of the present disclosure will now be described in detail with reference to certain embodiments thereof illustrated in the accompanying drawings which are given hereinbelow by way of illustration only, and thus are not limitative of the present disclosure, wherein.

Figures 1, 2:
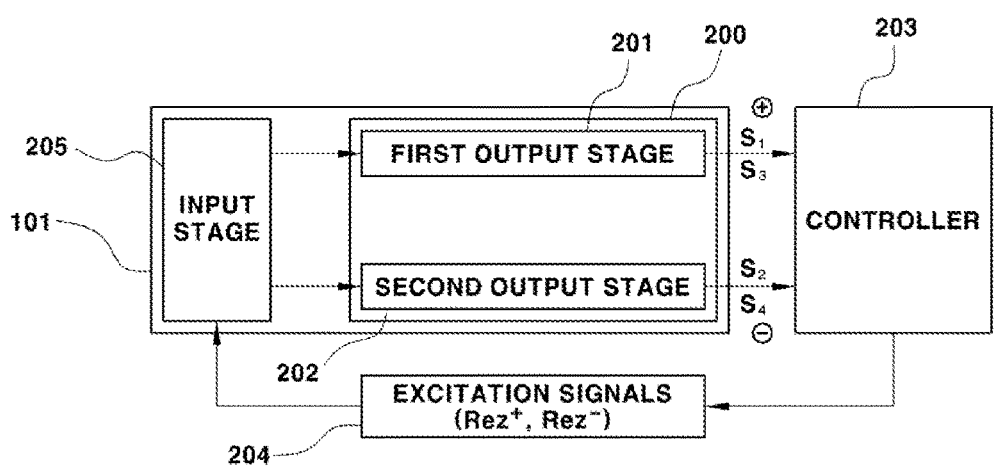
FIG. 1 shows an example of an infocode table obtained by a conventional method of detecting wiring mismatch of a resolver.
FIG. 2 is a block diagram illustrating a configuration of an apparatus of detecting wiring mismatch of a resolver.

It should be understood that the appended drawings are not necessarily to scale, presenting a somewhat simplified representation of various preferred features illustrative of the basic principles of the disclosure. The specific design features of the present disclosure as disclosed herein, including, for example, specific dimensions, orientations, locations, and shapes will be determined in part by the particular intended application and use environment. In the figures, reference numbers refer to the same or equivalent parts of the present disclosure throughout the several figures of the drawing.

DETAILED DESCRIPTION

Hereinafter reference will now be made in detail to various embodiments of the present disclosure. It will be understood that present description is not intended to limit the disclosure to the embodiments disclosed herein. On the contrary, the disclosure is intended to cover not only the disclosed embodiments, but also various alternatives, modifications, equivalents and other embodiments, which may be included within the spirit and scope of the disclosure as defined by the appended claims.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Additionally, it is understood that one or more of the below methods, or aspects thereof, may be executed by at least one controller. The term "controller" may refer to a hardware device that includes a memory and a processor. The memory is configured to store program instructions, and the processor is configured to execute the program instructions to perform one or more processes which are described further below. Moreover, it is understood that the below methods may be executed by an apparatus comprising the controller, whereby the apparatus is known in the art to be suitable for detecting wiring mismatch of a resolver.

Furthermore, the controller of the present disclosure may be embodied as non-transitory computer readable media on a computer readable medium containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

FIG. 2 is a block diagram illustrating a configuration of an apparatus of detecting wiring mismatch of a resolver. Referring to FIG. 2, an apparatus of detecting wiring mismatch of a resolver may include a resolver 101 and a controller 203. In order for vector control of a motor or an induction motor used in a hybrid electric vehicle (HEV) or an electric vehicle (EV), coordinate system needs to be set in synchronization of the flux distribution of the motor. For this, it is necessary to determine the absolute location of the rotor of the motor. The resolver 101 is used to detect the absolute location of the rotor. By accurately sensing the individual phases of the rotor through the resolver 101, it is possible to perform motor speed control and torque control essential for HEV and EV.

The resolver 101 may include an input stage 205 to which a first input signal Rez+ and a second input signal Rez− constituting excitation signals 204 are input, a first output stage 201 to output a first output signal $S_1$ and a third output signal $S_3$ constituting a sine signal generated from the excitation signals 204, and a second output stage 202 to output a second output signal $S_2$ and a fourth output signal $S_4$ constituting a cosine signal generated from the excitation signals 204. The first output signal $S_1$ may be a signal that is output from a plus (+) terminal of the first output stage 201, and the third output signal $S_3$ may be a signal that is output from a minus (−) terminal of the first output stage 201. Also, the second output signal $S_2$ may be a signal that is output from a plus (+) terminal of the second output stage 202, and the fourth output signal $S_4$ may be a signal that is output from a minus (−) terminal of the second output stage 202.

The controller 203 may control the resolver 101, and may be configured with one or more processors, e.g., a Central Processing Unit (CPU), and one or more memories, as described above. Preferably, the controller 203 may be further configured to include a Resolver-to-Digital Converter (RDC) connected to a CPU. In this case, a fault signal generated through the RDC and input to the CPU can be used to determine faults of the resolver 101.

Figure 3:
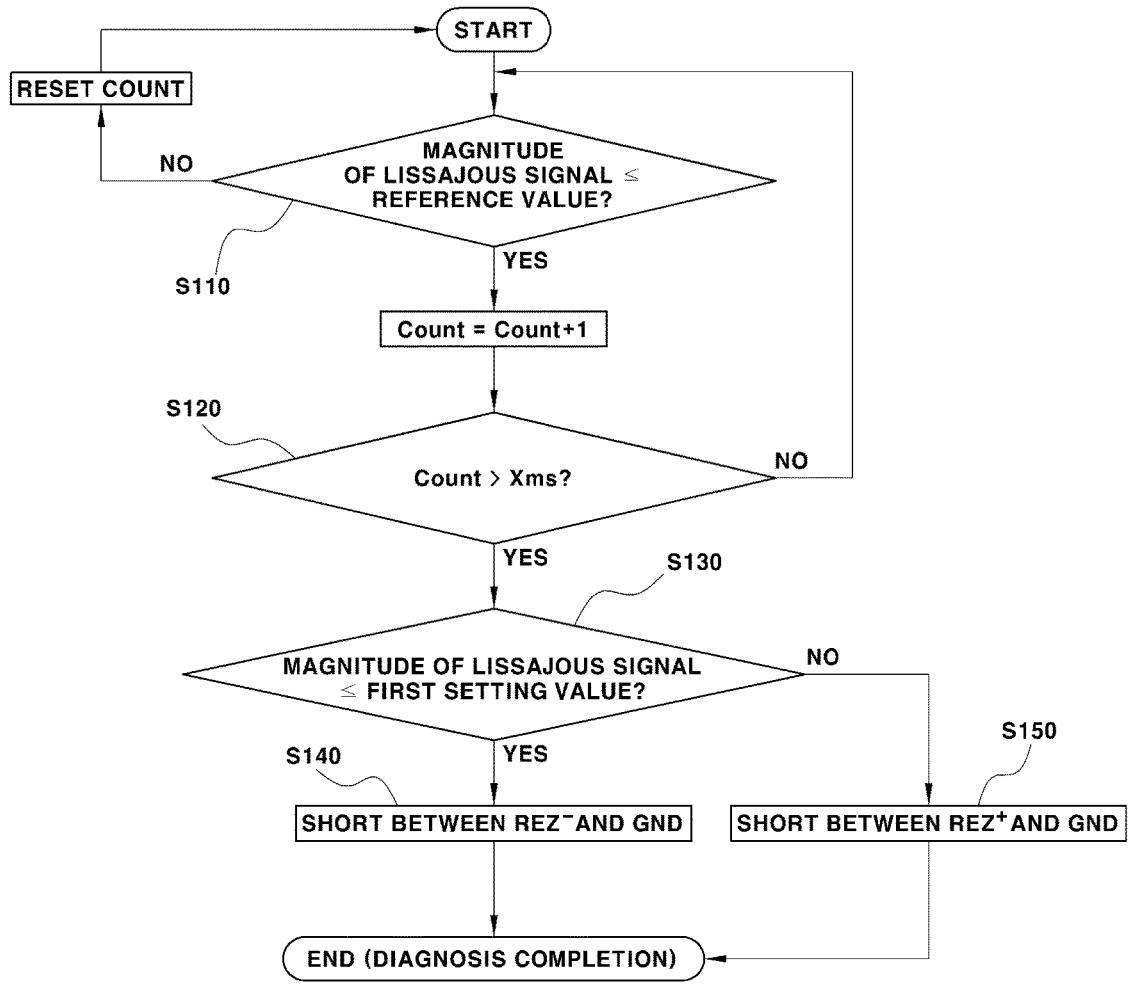
FIG. 3 is a flowchart illustrating a method of determining whether any one of first and second input signals Rez+ and Rez− is shorted to ground based on the magnitude of a Lissajous signal, according to embodiments of the present disclosure.

Hereinafter, embodiments of a method of detecting wiring mismatch of the resolver 101, which is performed by the controller 203, will be described in detail. An embodiment of a method of determining whether any one of input signals Rez+ and Rez− is shorted to ground (GND) by applying the method of detecting wiring mismatch of the resolver 101 will be described with reference to FIG. 3, below. The controller 203 may determine whether any one of the input signals Rez+ and Rez− is shorted to the GND for a reference time period (Xms) or more. This operation will be described in detail, below.

In operation S110, the controller 203 may compare a magnitude of a Lissajous signal obtained from sine and cosine signals output from the resolver 101, to a reference value. Herein, the magnitude of the Lissajous signal means the radius of a Lissajous figure obtained from the sine and cosine signals output from the output stage 200. The reference value may be obtained as an experimental value, and may be set to a predetermined value that is greater than the magnitudes of Lissajous signals obtained when the respective input signals Rez+ and Rez− are shorted to the GND. If any one of the input signals Rez+ and Rez− is shorted to the GND, the magnitude of the Lissajous signal is smaller than or equal to the reference value. In operation S120, the controller 203 may compare a time period for which the magnitude of the Lissajous signal is less than or equal to the reference value, to a reference time period Xms. If the controller 203 determines that the time period for which the magnitude of the Lissajous signal is less than or equal to the reference value is greater than the reference time period Xms, the controller 203 may determine that any one of the input signals Rez+ and Rez− is shorted to the GND for the reference time period Xms or more. Then, the controller 203 may determine which one of the first and second input signals Rez+ and Rez− is shorted to the GND based on the magnitude of the Lissajous signal. This operation will be described in detail, below.

In operation S130, the controller 203 may compare the magnitude of the Lissajous signal obtained from the sine and cosine signals output from the resolver 101, to a first setting value. Herein, the first setting value may be set to a predetermined value that is less than a magnitude of a Lissajous signal of output signals measured when the first input signal Rez+ is shorted to the GND, and greater than a magnitude of a Lissajous signal of output signals measured when the second input signal Rez− is shorted to the GND. If the controller 203 determines that the magnitude of the Lissajous signal is less than or equal to the first setting value, the controller 203 determines that the second input signal Rez– is shorted to the GND, in operation S140. If the controller 203 determines that the magnitude of the Lissajous signal is greater than the first setting value, the controller 203 determines that the first input signal Rez+ is shorted to the GND, in operation S150. As such, according to the method of detecting wiring mismatch of the resolver 101, it is possible to determine an input signal shorted to the GND and to thereby accurately determine a fault of the resolver 101.

Now, embodiments of a method of determining whether the first input signal Rez+ is shorted to any one of output signals $S_1$ and $S_3$ of the first output stage 201 by applying the method of detecting wiring mismatch of the resolver 101 will be described with reference to FIG. 4. The controller 203 may determine whether the first input signal Rez+ is shorted to any one of the first and third output signals $S_1$ and $S_3$ for a period of time that is greater than or equal to a reference time period Xms. In the current embodiments, a case in which the first input signal Rez+ is selected as a target signal is described. However, the second input signal Rez– can be also selected as a target signal. This operation will be described in detail, below.

In operation S210, the controller 203 may compare an average magnitude value of the first and third output signals $S_1$ and $S_3$ output from the resolver 101 to a reference value. Herein, the reference value may be obtained as an experimental value, and may be set to a predetermined value that is less than an average magnitude value of the third output signal $S_3$ measured when the first input signal Rez+ is shorted to the respective first and third output signals $S_1$ and $S_3$. If the first input signal Rez+ is shorted to any one of the first and third output signals $S_1$ and $S_3$, the average magnitude value of the third output signal $S_3$ is greater than the reference value. Then, in operation S220, the controller 203 may compare a time period for which the average magnitude value of the third output signal $S_3$ is greater than the reference value, to the reference time period Xms. If the controller 203 determines that the time period for which the average magnitude value of the third output signal $S_3$ is greater than the reference value is greater than the reference time period Xms, the controller 203 may determine that the first input signal Rez+ is shorted to any one of the first and third output signals $S_1$ and $S_3$ for the period of time that is greater than or equal to the reference time period Xms. Then, the controller 203 may determine which one of the first and third output signals $S_1$ and $S_3$ is shorted to the first input signal Rez+ , based on the average magnitude value of the third output signal $S_3$. This operation will be described in detail, below.

In operation S230, the controller 203 may compare the average magnitude value of the third output signal $S_3$ output from the resolver 101, to a second setting value. Herein, the second setting value may be set to a predetermined value that is greater than an average magnitude value of the third output signal $S_3$ measured when the first input signal Rez+ is shorted to the first output signal $S_1$, and less than an average magnitude value of the third output signal $S_3$ measured when the first input signal Rez+ is shorted to the third output signal $S_3$. If the controller 203 determines that the average magnitude value of the third output signal $S_3$ is less than the second setting value, the controller 203 may determine that the first input signal Rez+ is shorted to the first output signal $S_1$, in operation S240. If the controller 203 determines that the average magnitude value of the third output signal $S_3$ is greater than or equal to the second setting value, the controller 203 may determine that the first input signal Rez+ is shorted to the third output signal $S_3$, in operation S250. As such, according to the method of detecting wiring mismatch of the resolver 101, it is possible to determine which one of the first and third output signals $S_1$ and $S_3$ is shorted to the first input signal Rez+, thereby accurately determining a fault of the resolver 101.

Figure 4:
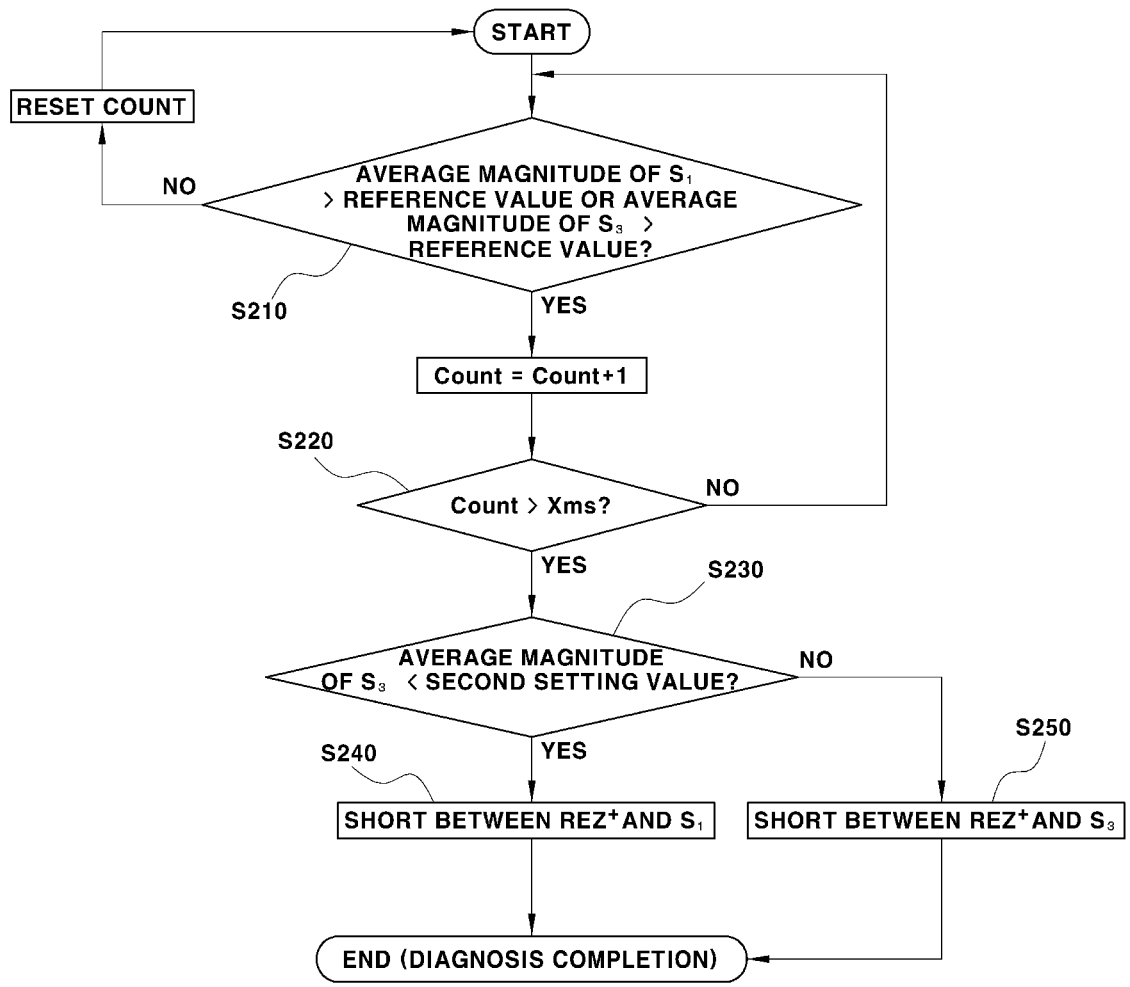
FIG. 4 is a flowchart illustrating a method of determining whether any one of first and second input signals Rez+ and Rez− is shorted to any one of output signals $S_1$ and $S_3$, according to embodiments of the present disclosure.

In the embodiments shown in FIG. 4, whether the first input signal Rez+ is shorted to any one of the first and third output signals $S_1$ and $S_3$ is determined, however, whether the second input signal Rez– is shorted to any one of the first and third output signals $S_1$ and $S_3$ can also be determined using the same method. In this case, the reference value and the second setting value can be respectively obtained from values measured when the second input signal Rez– is shorted to the respective first and third output signals $S_1$ and $S_3$.

Hereinafter, embodiments of a method of determining whether the first input signal Rez+ is shorted to any one of the second and fourth output signals $S_2$ and $S_4$ of the second output stage 202 by applying the method of detecting wiring mismatch of the resolver 101 will be described with reference to FIG. 5. The controller 203 may determine whether the first input signal Rez+ is shorted to any one of the second and fourth output signals $S_2$ and $S_4$ for a reference time period Xms or more. This operation will be described in detail, below.

In operation S310, the controller 203 may compare an average magnitude value of any one of the second and fourth output signals $S_2$ and $S_4$ output from the resolver 101, to a reference value. Herein, the reference value may be obtained as an experimental value, and may be set to a predetermined value that is less than an average magnitude value of the fourth output signal $S_4$ measured when the first input signal Rez+ is shorted to the respective second and fourth output signals $S_2$ and $S_4$. If the first input signals Rez+ is shorted to any one of the second and fourth output signals $S_2$ and $S_4$, the average magnitude value of the fourth output signal $S_4$ is greater than the reference value. Then, in operation S320, the controller 203 may compare a time period for which the average magnitude value of the fourth output signal $S_4$ is greater than the reference value, to a reference time period Xms. If the controller 203 determines that the time period for which the average magnitude value of the fourth output signal $S_4$ is greater than the reference value is greater than the reference time period Xms, the controller 203 may determine that the first input signal Rez+ is shorted to any one of the second and fourth output signals $S_2$ and $S_4$ for the period of time that is greater than or equal to the reference time period Xms. Thereafter, the controller 203 may determine which one of the second and fourth output signals $S_2$ and $S_4$ is shorted to the first input signal Rez+, based on the average magnitude value of the fourth output signal $S_4$. This operation may be described in detail, below.

In operation S330, the controller 203 may compare the average magnitude value of the fourth output signal $S_4$ output from the resolver 101, to a third setting value. Herein, the third setting value may be set to a predetermined value that is greater than an average magnitude value of the fourth output signal $S_4$ measured when the first input signal Rez+ is shorted to the second output signal $S_2$, and smaller than an average magnitude value of the fourth output signal $S_4$ measured when the first input signal Rez+ is shorted to the fourth output signal $S_4$. If the controller 203 determines that the average magnitude value of the fourth output signal $S_4$ is less than the third setting value, the controller 203 may determine that the first input signal Rez+ is shorted to the second output signal $S_2$, in operation S340. If the controller 203 determines that the average magnitude value of the fourth output signal $S_4$ is greater than or equal to the third setting value, the controller 203 may determine that the first input signal Rez+ is shorted to the fourth output signal $S_4$, in operation S350. As such, according to the method of detecting wiring mismatch of the resolver 101, it is possible to determine which one of the second and fourth output signals $S_2$ and $S_4$ is shorted to the first input signal Rez+ and to thereby accurately determining wiring mismatch of the resolver 101.

Figure 5:
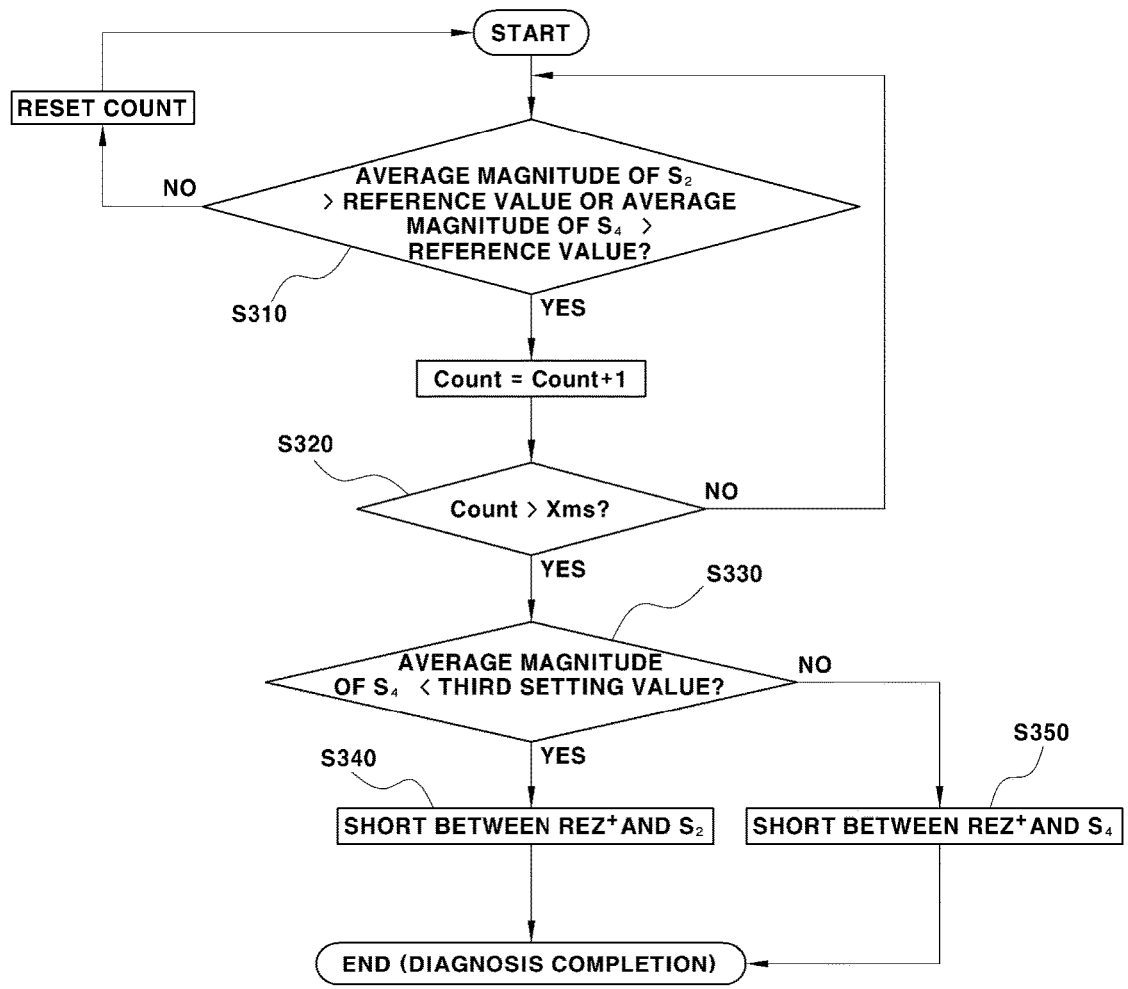
FIG. 5 is a flowchart illustrating a method of determining whether any one of first and second input signals Rez+ and Rez− is shorted to any one of output signals $S_2$ and $S_4$, according to embodiments of the present disclosure.

Preferably, as shown in the flowcharts of FIGS. 4 and 5, average levels of the magnitudes of the third and fourth output signals $S_3$ and $S_4$ are measured as targets that are to be respectively compared to the second and third setting values to determine a short. The reason is because averages of the magnitudes of the third output signal $S_3$ and the fourth output signal $S_4$ show more significant differences when the output terminals of the respective output signals R3 and R4 are shorted, than the first output signal $S_1$ and the second output signal $S_2$.

In this specification, embodiments of the method, apparatus, and computer readable medium for detecting wiring mismatch of the resolver 101 have been described. However, the scope of the technical spirit of the present disclosure is not limited to the embodiments of the present disclosure. For example, the locations of individual components of the apparatus of detecting wiring mismatch of the resolver 101, an arrangement of infocode, and a circuit configuration method of the resolver 101 should be interpreted as being protected within the same or equivalent scope of the present disclosure. Furthermore, the signals mentioned in the embodiments can be considered as including terminals from which the signals are extracted, and accordingly, the shorts of the signals can be interpreted as shorts of the corresponding terminals from which the respective signals are output.

Therefore, by providing the method of detecting wiring mismatch of the resolver, a method of distinguishing different mismatching wirings having the same infocode from each other can be provided. Moreover, a method of overcoming a problem that different infocodes appear with respect to a mismatching wiring can be achieved. Accordingly, it is possible to accurately detect wiring mismatch of the resolver as compared to the related art. Also, by accurately detecting wiring mismatch of the resolver, it is possible to significantly reduce working time. In addition, by accurately detecting wiring mismatch of the resolver, it is possible to maintain durability of the resolver and the electric motor.

The disclosure has been described in detail with reference to embodiments thereof. However, it will be appreciated by those skilled in the art that changes may be made in these embodiments without departing from the principles and spirit of the disclosure, the scope of which is defined in the appended claims and their equivalents.

What is claimed is:

1. A method of detecting wiring mismatch of a resolver, the resolver including an input stage to which a first input signal Rez+ and a second input signal Rez− constituting excitation signals are input, a first output stage to output a first output signal $S_1$ and a third output signal $S_3$ constituting a sine signal generated from the excitation signals, and a second output stage to output a second output signal $S_2$ and a fourth output signal $S_4$ constituting a cosine signal generated from the excitation signals, the method comprising:

determining whether the first input signal Rez+ or the second input signal Rez− is shorted to ground for an amount of time that is greater than or equal to a reference time period; and when it is determined that the first input signal Rez+ or the second input signal Rez− is shorted to the ground for the amount of time that is greater than or equal to the reference time period, determining which one of the first input signal Rez+ and the second input signal Rez− is shorted to the ground, based on a magnitude of a Lissajous signal obtained from the sine signal and the cosine signal, wherein the determining of which one of the first input signal Rez+ and the second input signal Rez− is shorted to the ground comprises:

comparing the magnitude of the Lissajous signal to a first setting value;

determining that the second input signal Rez− is shorted to the ground when the magnitude of the Lissajous signal is less than or equal to the first setting value; and determining that the first input signal Rez+ is shorted to the ground when the magnitude of the Lissajous signal is greater than the first setting value.

2. The method of claim 1, wherein the first setting value is set to a predetermined value between an experimental value of a magnitude of a Lissajous signal measured when the second input signal Rez− is shorted to the ground and an experimental value of a magnitude of a Lissajous signal measured when the first input signal Rez+ is shorted to the ground.

3. A method of detecting wiring mismatch of a resolver, the resolver including an input stage to which a first input signal Rez+ and a second input signal Rez− constituting excitation signals are input, a first output stage to output a first output signal $S_1$ and a third output signal $S_3$ constituting a sine signal generated from the excitation signals, and a second output stage to output a second output signal $S_2$ and a fourth output signal $S_4$ constituting a cosine signal generated from the excitation signals, the method comprising:

determining whether a target signal selected from the first input signal Rez+ and the second input signal Rez− is shorted to the first output stage for an amount of time that is greater than or equal to a predetermined time period; and when it is determined that the target signal is shorted to the first output stage for the amount of time that is greater than or equal to the reference time period, determining which one of the first output signal S1 and the third input signal S3 is shorted to the target signal, based on an average magnitude value of the third output signal S3, wherein the determining of which one of the first output signal S1 and the third input signal S3 is shorted to the target signal comprises:

comparing the average magnitude value of the third output signal S3 to a second setting value;

determining that the first output signal S1 is shorted to the target signal when the average magnitude value of the third output signal S3 is less than the second setting value; and determining that the third output signal S3 is shorted to the target signal when the average magnitude value of the third output signal S3 is greater than or equal to the second setting value.

4. The method of claim 3, wherein the second setting value is set to a predetermined value between an average magnitude value of the third output signal $S_3$ measured when the first output signal $S_1$ is shorted to the target signal and an average magnitude value of the third output signal $S_3$ measured when the third output signal $S_3$ is shorted to the target signal.

5. A method of detecting wiring mismatch of a resolver, the resolver including an input stage to which a first input signal Rez+ and a second input signal Rez− constituting excitation signals are input, a first output stage to output a first output signal $S_1$ and a third output signal $S_3$ constituting a sine signal generated from the excitation signals, and a second output stage to output a second output signal $S_2$ and a fourth output signal $S_4$ constituting a cosine signal generated from the excitation signals, the method comprising:
 determining whether the first input signal Rez+ is shorted to the second output stage for an amount of time that is greater than or equal to a predetermined time period; and
 when it is determined that the first input signal Rez+ is shorted to the second output stage for the amount of time that is greater than or equal to the reference time period, determining which one of the second output signal S2 and the fourth output signal S4 is shorted to the first input signal Rez+, based on an average magnitude value of the fourth output signal S4,
 wherein the determining of which one of the second output signal S2 and the fourth output signal S4 is shorted to the first input signal Rez+ comprises:
 comparing the average magnitude value of the fourth output signal S4 to a third setting value;
 determining that the second output signal S2 is shorted to the first input signal Rez+ when the average magnitude value of the fourth output signal S4 is less than the third setting value; and
 determining that the fourth output signal S4 is shorted to the first input signal Rez+ when the average magnitude value of the fourth output signal S4 is greater than or equal to the third setting value.

6. The method of claim 5, wherein the third setting value is set to a predetermined value between an average magnitude value of the fourth output signal $S_4$ measured when the second output signal is shorted to the first input signal Rez+ $S_2$ and an average magnitude value of the fourth output signal $S_4$ measured when the fourth output signal $S_4$ is shorted to the first input signal Rez+.

7. A non-transitory computer readable medium containing program instructions for detecting wiring mismatch of a resolver, the resolver including an input stage to which a first input signal Rez+ and a second input signal Rez− constituting excitation signals are input, a first output stage to output a first output signal $S_1$ and a third output signal $S_3$ constituting a sine signal generated from the excitation signals, and a second output stage to output a second output signal $S_2$ and a fourth output signal $S_4$ constituting a cosine signal generated from the excitation signals, the computer readable medium comprising:
 program instructions that determine, by the controller, whether the first input signal Rez+ or the second input signal Rez− is shorted to ground for an amount of time that is greater than or equal to a reference time period; and
 program instructions that determine, by the controller, which one of the first input signal Rez+ and the second input signal Rez− is shorted to the ground, based on a magnitude of a Lissajous signal obtained from the sine signal and the cosine signal, when it is determined that the first input signal Rez+ or the second input signal Rez− is shorted to the ground for the amount of time that is greater than or equal to the reference time period,
 wherein the determining of which one of the first input signal Rez+ and the second input signal Rez− is shorted to the ground comprises:
 comparing the magnitude of the Lissajous signal to a first setting value;
 determining that the second input signal Rez− is shorted to the ground when the magnitude of the Lissajous signal is less than or equal to the first setting value; and
 determining that the first input signal Rez+ is shorted to the ground when the magnitude of the Lissajous signal is greater than the first setting value.

8. A non-transitory computer readable medium containing program instructions for detecting wiring mismatch of a resolver, the resolver including an input stage to which a first input signal Rez+ and a second input signal Rez− constituting excitation signals are input, a first output stage to output a first output signal $S_1$ and a third output signal $S_3$ constituting a sine signal generated from the excitation signals, and a second output stage to output a second output signal $S_2$ and a fourth output signal $S_4$ constituting a cosine signal generated from the excitation signals, the computer readable medium comprising:
 program instructions that determine, by the controller, whether a target signal selected from the first input signal Rez+ and the second input signal Rez− is shorted to the first output stage for an amount of time that is greater than or equal to a predetermined time period; and
 program instructions that determine, by the controller, which one of the first output signal S1 and the third input signal S3 is shorted to the target signal, based on an average magnitude value of the third output signal S3, when it is determined that the target signal is shorted to the first output stage for the amount of time that is greater than or equal to the reference time period
 wherein the determining of which one of the first output signal S1 and the third input signal S3 is shorted to the target signal comprises:
 comparing the average magnitude value of the third output signal S3 to a second setting value;
 determining that the first output signal S1 is shorted to the target signal when the average magnitude value of the third output signal S3 is less than the second setting value; and
 determining that the third output signal S3 is shorted to the target signal when the average magnitude value of the third output signal S3 is greater than or equal to the second setting value.

9. A non-transitory computer readable medium containing program instructions for detecting wiring mismatch of a resolver, the resolver including an input stage to which a first input signal Rez+ and a second input signal Rez− constituting excitation signals are input, a first output stage to output a first output signal $S_1$ and a third output signal $S_3$ constituting a sine signal generated from the excitation signals, and a second output stage to output a second output signal $S_2$ and a fourth output signal $S_4$ constituting a cosine signal generated from the excitation signals, the computer readable medium comprising:
 program instructions that determine, by the controller, whether the first input signal Rez+ is shorted to the second output stage for an amount of time that is greater than or equal to a predetermined time period; and program instructions that determine, by the controller, which one of the second output signal S2 and the fourth output signal S4 is shorted to the first input signal Rez+, based on an average magnitude value of the fourth output signal S4, when it is determined that the first input signal Rez+ is shorted to the second output stage for the amount of time that is greater than or equal to the reference time period, wherein the determining of which one of the second output signal S2 and the fourth output signal S4 is shorted to the first input signal Rez+ comprises:

comparing the average magnitude value of the fourth output signal S4 to a third setting value;

determining that the second output signal S2 is shorted to the first input signal Rez+ when the average magnitude value of the fourth output signal S4 is less than the third setting value; and determining that the fourth output signal S4 is shorted to the first input signal Rez+ when the average magnitude value of the fourth output signal S4 is greater than or equal to the third setting value.

* * * * *